(12) United States Patent
Ji et al.

(10) Patent No.: US 6,400,639 B1
(45) Date of Patent: Jun. 4, 2002

(54) WORDLINE DECODER SYSTEM AND METHOD

(75) Inventors: Brian L. Ji, Fishkill; Toshiaki Kirihata, Poughkeepsie; Dmitry G. Netis, Brooklyn, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/712,628

(22) Filed: Nov. 14, 2000

(51) Int. Cl.[7] ................................................ G11C 8/00
(52) U.S. Cl. .......................... 365/230.06; 365/230.03; 365/51
(58) Field of Search ................. 365/230.06, 230.03, 365/51, 63

(56) References Cited

U.S. PATENT DOCUMENTS 6,047,352 A * 4/2000 Lakhani et al. ..... 365/230.06 X
6,233,198 B1 * 5/2001 Choi ...................... 365/230.06
6,240,039 B1 * 5/2001 Lee et al. ............... 365/230.06

* cited by examiner

Primary Examiner—Huan Hoang
(74) Attorney, Agent, or Firm—Eric W. Petraske; Cantor Colburn LLP

(57) ABSTRACT

A memory decoder system is disclosed. In an exemplary embodiment of the invention, the system includes a matrix of memory cells, arranged into rows and columns, with a plurality of wordline drivers corresponding to each row in the matrix. A group of wordline driver-decoder blocks each contains a subset of the plurality of wordline drivers therein, with each of the wordline driver-decoder blocks being separated by a row control block. The row control block includes control circuitry for the wordline drivers. For any given wordline driver-decoder block, a first group of wordline drivers contained therein is controlled by a row control block located on one side of the given wordline driver-decoder block, while a second group of wordline drivers contained therein is controlled by a row control block located on an opposite side of the given wordline driver-decoder block.

8 Claims, 2 Drawing Sheets

WORDLINE DECODER SYSTEM AND METHOD

FIELD OF THE INVENTION

This invention relates to decoding wordlines in dynamic random access memory arrays (DRAMs).

BACKGROUND OF THE INVENTION

Both static random access memory (SRAM) and dynamic random access memory (DRAM) have one or more arrays of memory cells organized into rows (wordlines) and columns (bitlines). Each memory cell represents a single bit and is accessed by a unique address defined by the intersection of a row and a column. In SRAM, each cell is typically directly associated with an input/output pin. In DRAMs, each input/output pin is connected to each memory cell via a "sense amplifier", which is usually one or more transistors configured to hold and amplify the charge to be read from or written to the cell. These sense amplifiers take up space and increase capacitance, there by resulting in a "sense amplifier penalty."

In order to achieve high speed operations and high memory capacities in DRAMs, memory designers are forced to reduce the row decoding path required to activate a wordline every time a new page of memory is accessed. On the other hand, high-density memory designs require more memory cells per bitline and therefore more sense amplifiers and wordline drivers. The increase in the number of wordline drivers results in increased wordline rise time components attributable to resulting higher diffusion and gate capacitances of the wordline driver control and reset signals. Hence, reading and writing to the wordlines is delayed in the manner of a classic resistance-capacitance (RC) delay.

What is needed is a method and design of decoding wordline drivers so as to overcome such RC delays.

SUMMARY OF THE INVENTION

The above discussed and other drawbacks and deficiencies of the prior art are overcome or alleviated by a memory decoder system. In an exemplary embodiment of the invention, the system includes a matrix of memory cells, arranged into rows and columns, with a plurality of wordline drivers corresponding to each row in the matrix. A group of wordline driver-decoder blocks each contains a subset of the plurality of wordline drivers therein, with each of the wordline driver-decoder blocks being separated by a row control block. The row control block includes control circuitry for the wordline drivers. For any given wordline driver-decoder block, a first group of wordline drivers contained therein is controlled by a row control block located on one side of the given wordline driver-decoder block, while a second group of wordline drivers contained therein is controlled by a row control block located on an opposite side of the given wordline driver-decoder block.

DETAILED DESCRIPTION OF THE INVENTION

Figure 1B:
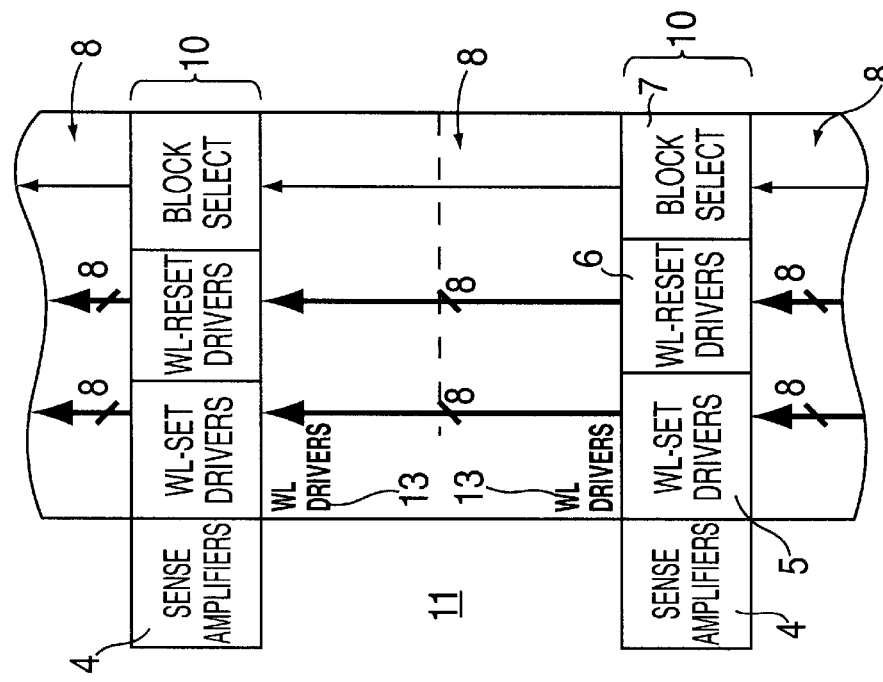
FIG. 1 shows an embodiment of the invention in comparison to the prior art.
Figure 1A:
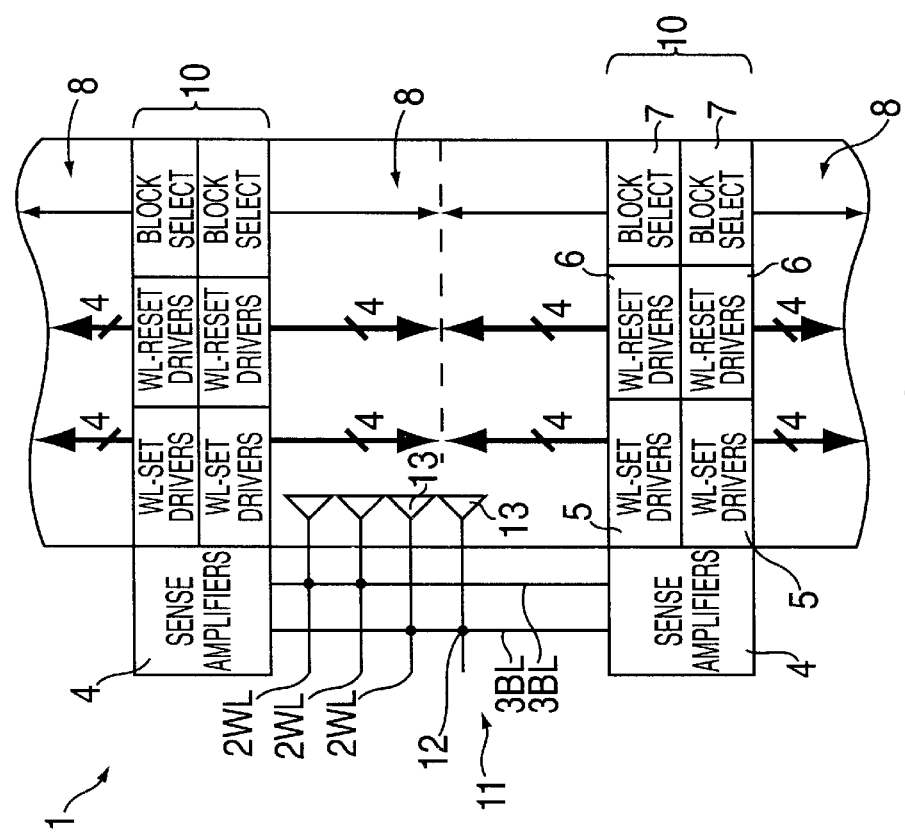

Referring to FIG. 1(a) there is shown an dynamic random access memory (DRAM) architecture 1 in accordance with an embodiment of the invention in comparison to a prior art version shown as FIG. 1(b). Similar to existing architectures, the DRAM architecture 1 of the invention comprises an array of memory cells 12 arranged in a matrix 11 of wordlines (WLs) 2 and bitlines (BLs) 3. The WLs 2 are driven by wordline drivers 13. When a WL2 is activated, data bits are transferred to bitlines (BLs) 3, and sensed by sense amplifiers (SAs) 4. The process of addressing the proper data bits and transferring the data is referred to as "decoding" in the semiconductor art.

Each memory cell in a DRAM is associated with an individual sense amplifier 4, well known in the art, that holds and amplifies the voltage that is written to or read from the memory cell. Hence, each bit is read or written through each sense amplifier 4 rather than directly read from or written to each memory cell. Sense amplifiers 4 generally comprise little more than a pair of transistors, while each DRAM memory cell generally comprises a storage capacitor and an access transistor (not shown).

Typically, a row control block 10 comprising wordline-set (WL-set) drivers 5, wordline-reset (WL-reset) drivers 6, and block selectors 7 would support all the wordline drivers 13, and thus all the wordlines, all the way up to the next row control block 10. The WL-set drivers 5 activate the wordline drivers 13, while the WL-reset drivers 6 quash the signals of the WL-set drivers 5. The block select 7 activates or deactivates the block of memory controlled by the control block 10. The set of all wordline drivers 13 between control blocks 10 is referred to as a wordline driver-decoder block 8 for the purposes of this specification. Each wordline driver-decoder block 8 is responsible for driving the matrix 11 of memory cells 12 located between the sense amplifiers 4 (shown most particularly in FIG. 1(a)). In FIG. 1(b), there is shown a prior art DRAM architecture wherein the row control block 10 (comprising the WL-set drivers 5 and WL-reset drivers 6, and block select 7) drives wordline drivers 13 to activate one of 2 k (2048 bits) wordlines in the memory array 11. In contrast, for the inventive architecture 1 shown in FIG. 1(a), each row control block 10 of drivers is split into dual drivers and arranged to control only half of the wordline drivers 13 that would normally be controlled.

Thus, each driver in control block 10 is connected to only half the number of wordline drivers as the prior art. In other words, each wordline driver-decoder block 8 is controlled by more than one control block 10. As opposed to the configuration of FIG. 1(b), wherein the signal paths from the various driver elements 5, 6 and 7, can travel the entire length of wordline driver-decoder block 8 before reaching the furthest wordline driver 13 associated therewith, the configuration of FIG. 1(a) reduces this distance in half. This is appreciated upon inspection and comparison of the signal flow paths of FIGS. 1(a) and 1(b). In FIG. 1(b), the signals are shown traveling from one complete set of driver elements in a control block 10 in an upward direction. On the other hand, the architecture of FIG. 1(a) splits the driver elements into adjacent control blocks 10. Thereby, the signals from adjacent control blocks flow in an inward direction, effectively reducing the distance traveled by half.

Although the drawings and examples depict an embodiment where two control blocks 10 control a wordline driver-decoder block 8, it is to be understood that the teachings of this invention are generally applicable to any number greater than one of control blocks 10, WL-set drivers 5, WL-reset drivers 6, or block selects 7. The result is substantially lowered gate and junction capacitance on these connections, which in turn results in faster response times. The wiring resistance is also reduced, as much as by one-half, thereby resulting in reducing the RC time constant to as little as one-fourth its usual value.

Figure 2:
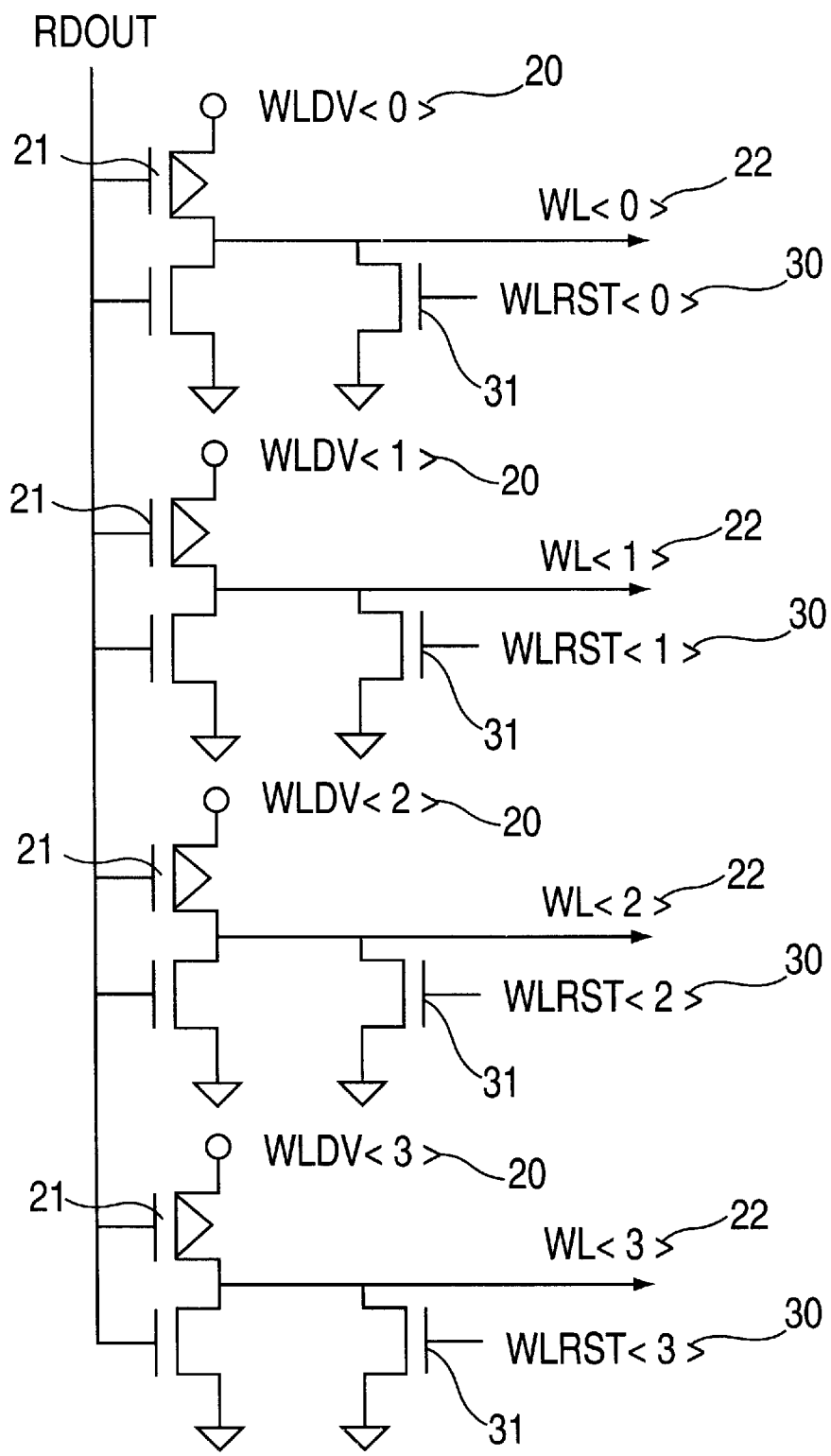
FIG. 2 shows an embodiment of a circuit of the invention.

Referring to FIG. 2, there is shown an embodiment of a circuit for the wordline decoder/drivers 13 wherein the WL-set signals 20 are input into the load-carrying sources of transistors 21, here shown as a positive field effect transistors (PFETs) which in turn may activate (to high) one wordline 22, if the corresponding signal RDOUT, applied to the gates, from the other (higher bits) WL decoders is high for a particular decoder. WL-reset signals 30 may be input into the gates of "killer" transistors 31, here shown as negative field effect transistors (NFETs), to thereby quash the wordline driver signal on any particular line by shorting out the corresponding output terminal 22 to ground.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about, or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A memory decoder system, comprising:
   a matrix of memory cells, arranged into rows and columns;
   a plurality of wordline drivers corresponding to each row in said matrix;
   a group of wordline driver-decoder blocks, each one of said wordline driver-decoder blocks containing a subset of said plurality of wordline drivers therein; and
   each of said wordline driver-decoder blocks being separated by a row control block, said row control block including control circuitry for controlling said wordline drivers;
   wherein, for any given wordline driver-decoder block, a first group of wordline drivers contained therein is controlled by a row control block located on one side of said given wordline driver-decoder block; and
   a second group of wordline drivers contained therein is controlled by a row control block located on an opposite side of said given wordline driver-decoder block.

2. The memory decoder system of claim 1, wherein each of said row control blocks further comprise:
   a plurality of wordline-set drivers;
   a plurality of wordline-reset drivers; and
   a plurality of block selects.

3. The memory decoder system of claim 2, wherein:
   said plurality of wordline-set drivers is divided into a first group of wordline-set drivers and a second group of wordline-set drivers;
   said plurality of wordline-reset drivers is divided into a first group of wordline-reset drivers and a second group of wordline-reset drivers; and
   said plurality of block selects is divided into a first group of block selects and a second group of block selects;
   wherein said first group of wordline-set drivers, said first group of wordline-reset drivers and said first group of block selects are coupled to a wordline driver-decoder block on one side of a given row control block and;
   said second group of wordline-set drivers, said second group of wordline-reset drivers and said second group of block selects are coupled to another wordline driver-decoder block on the opposite side of said given row control block.

4. The memory decoder system of claim 1, wherein:
   said first group of wordline drivers is located on a top half of said given wordline driver-decoder block; and
   said second group of wordline drivers is located on a bottom half of said given wordline driver-decoder block.

5. A method for decoding a memory array having memory cells arranged into rows and columns, with each row in the array further having a wordline driver associated therewith, the method comprising:
   configuring a group of wordline driver-decoder blocks, each one of said wordline driver-decoder blocks containing therein a subset of the total number of wordline drivers associated with the array rows; and
   separating each of said wordline driver-decoder blocks with a row control block, said row control block including control circuitry for controlling said wordline drivers;
   wherein, for any given wordline driver-decoder block, a first group of wordline drivers contained therein is controlled by a row control block located on one side of said given wordline driver-decoder block; and
   a second group of wordline drivers contained therein is controlled by a row control block located on an opposite side of said given wordline driver-decoder block.

6. The method of claim 5, wherein each of said row control blocks further comprise:
   a plurality of wordline-set drivers;
   a plurality of wordline-reset drivers; and
   a plurality of block selects.

7. The method of claim 6, wherein;
   dividing said plurality of wordline-set drivers into a first group of wordline-set drivers and a second group of wordline-set drivers;
   dividing said plurality of wordline-reset drivers into a first group of wordline-reset drivers and a second group of wordline-reset drivers; and
   dividing said plurality of block selects into a first group of block selects and a second group of block selects;
   wherein said first group of wordline-set drivers, said first group of wordline-reset drivers and said first group of block selects are coupled to a wordline driver-decoder block on one side of a given row control block and;
   said second group of wordline-set drivers, said second group of wordline-reset drivers and said second group of block selects are coupled to another wordline driver-decoder block on the opposite side of said given row control block.

8. The method of claim 5, wherein:
   said first group of wordline drivers is located on a top half of said given wordline driver-decoder block; and
   said second group of wordline drivers is located on a bottom half of said given wordline driver-decoder block.

* * * * *